(12) United States Patent
Katti et al.

(10) Patent No.: US 7,248,496 B2
(45) Date of Patent: Jul. 24, 2007

(54) MRAM READ SEQUENCE USING CANTED BIT MAGNETIZATION

(75) Inventors: Romney R. Katti, Shorewood, MN (US); Owen J. Hynes, Maple Plain, MN (US); Daniel S. Reed, Otsego, MN (US); Hassan Kaakani, Excelsior, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/273,214

(22) Filed: Nov. 14, 2005

(65) Prior Publication Data

US 2007/0109839 A1    May 17, 2007

(51) Int. Cl.
*G11C 7/00* (2006.01)
(52) U.S. Cl. ....................... 365/158; 365/173
(58) Field of Classification Search ................ 365/158, 365/173
See application file for complete search history.

(56) References Cited

U.S. PATENT DOCUMENTS

| 5,756,366 | A |   | 5/1998  | Berg |
|-----------|---|---|---------|------|
| 5,764,567 | A | * | 6/1998  | Parkin ........................ 365/173 |
| 6,114,719 | A | * | 9/2000  | Dill et al. ................... 257/295 |
| 6,147,922 | A |   | 11/2000 | Hurst |
| 6,175,525 | B1|   | 1/2001  | Fulkerson |
| 6,178,111 | B1|   | 1/2001  | Sather |
| 6,455,177 | B1|   | 9/2002  | Everitt |
| 6,493,258 | B1|   | 12/2002 | Lu |

OTHER PUBLICATIONS

Hong et al., "Magnetic element Shape for Magnetic Random Access Memory (MRAM)", (May 28-29, 2003) (http://www.cambr.uidaho.edu/symposiums/symp11.asp).

Daughton, "Magnetoresistive Random Access Memory (MRAM)," pp. 1-13 (Feb. 4, 2000).

Hertel, "Thickness Dependence of Magnetization Structures in Thin Permalloy Rectangles", Max-Planck-Institut fur Mikrostrukturphysik, Weinberg 2, 06120 Halle, Germany. Feb. 27, 2003.

Slaughter, "Magnetic Tunnel Junction Materials for Electronic Applications,"JOM (Jun. 2000). (www.tms.org/pubs/journals/JOM/0006/Slaughter/Slaughter-0006.html).

* cited by examiner

*Primary Examiner*—Micheal Tran
(74) *Attorney, Agent, or Firm*—McDonnell Boehnen Hulbert & Berghoff LLP

(57) ABSTRACT

A new read scheme is provided for an MRAM bit having a pinned layer (fixed) and a storage layer (free) sandwiching a nonmagnetic spacer layer. By applying a magnetic field to the bit at least partially orthogonal to the easy axis of the bit, the magnetization direction of the storage layer can be partially rotated or canted without switching the logical state of the MRAM bit. The resistivity of the bit is measured (calculated based on a voltage/current relationship) in two ways: (i) with the magnetization direction of the storage layer partially rotated in a first direction and (ii) with the magnetization direction of the storage layer in its bi-stable orientation parallel to the easy axis. Those measures can then be used to compare and determine the logical state of the storage layer. For instance, if the canted resistivity is greater than the uncanted resistivity then the magnetization directions of the pinned and storage layer are parallel, and if the canted resistivity is less than the uncanted resistivity then the magnetization directions of the pinned and storage layer are opposite.

20 Claims, 4 Drawing Sheets

MRAM READ SEQUENCE USING CANTED BIT MAGNETIZATION

GOVERNMENT RIGHTS

The United States Government has acquired certain rights in this invention pursuant to Contract No. DTRA01-00-C-0002 awarded by the Defense Threat Reduction Agency (DTRA).

FIELD

The invention relates to magnetic random access memory (MRAM) and more particularly to a system and method for determining a logical state of an MRAM bit.

BACKGROUND

The discovery of the giant magnetoresistive (GMR) effect has led to the development of a number of spin-based electronic devices. The GMR effect is observed in certain thin-film devices that are made up of alternating ferromagnetic and nonmagnetic layers. In a typical device, the relative orientations of magnetic directions of the ferromagnetic layers define a binary state of the device. The resistance across a device is generally lowest when the magnetic directions of the ferromagnetic layers are in a parallel orientation and highest when the magnetic directions are in an antiparallel orientation.

One type of GMR device is commonly referred to as a "spin valve." GMR devices, including spin valves, can be used as data storage elements in magnetic random access memory (MRAM) devices. In this regard, exemplary MRAM applications of GMR devices are described in U.S. Pat. Nos. 6,147,922; 6,175,525; 6,178,111; 6,493,258, and U.S. Pat. App. Pub. No. 2005/0226064, all of which are incorporated herein by reference.

A spin valve typically includes two or more ferromagnetic layers that are separated by a thin layer of a non-magnetic metal (often copper) and also includes an antiferromagnetic layer that "pins" the magnetization direction of one of the ferromagnetic layers. FIG. 1a illustrates (in a simplified form) the layers in a typical spin valve 10 as seen from a side view. As shown in FIG. 1a, spin valve 10 includes ferromagnetic layers 12 and 14 separated by a nonmagnetic layer 16. In a typical arrangement, one of the magnetic layers is configured to be a fixed layer 14. Fixed layer 14 is adjacent to an anti-ferromagnetic layer 18, such that the magnetization direction of fixed layer 14 is "pinned" in a particular orientation. The arrow in fixed layer 14 indicates an exemplary pinned orientation, though, in general, the orientation could be pinned in either direction. Thus, the magnetization direction of fixed layer 14 remains relatively fixed when operational magnetic fields are applied to spin valve 10. A second magnetic layer 12 is termed a free layer 12. In contrast with the fixed layer 14, the magnetization direction of free layer 12 is free to switch between parallel and antiparallel orientations, as indicated by the double-arrow symbol in free layer 12. By applying an appropriate magnetic field to spin valve 10, the magnetization direction of free layer 12 can be inverted while the magnetization direction of fixed layer 14 remains the same.

FIG. 1b shows a three-dimensional view of the spin valve 10 of FIG. 1a. As shown, the spin valve 10 has a hard-axis (short-axis) and an easy-axis (long-axis). In the absence of an applied magnetic field, the magnetization directions of both the free layer 12 and the fixed layer 14 run substantially parallel to the easy-axis.

During a read sequence of a spin valve, a reference circuit is generally depended upon when determining the logical state of a spin valve.

SUMMARY

An MRAM bit is configured to be self referencing during a read sequence so that, for instance, a reference bit is not used. The MRAM bit includes a storage layer having a bi-stable switchable magnetization direction, a reference layer having a fixed magnetization direction, and a nonmagnetic spacer layer sandwiched between the storage layer and the reference layer. The magnetization direction of the storage layer stores a binary datum.

In the absence of an applied magnetic field, the magnetization direction of the storage layer will generally be in one of the bi-stable directions that are most often along the easy axis of the MRAM bit. In the presence of an applied magnetic field, the magnetization direction of the storage layer can rotate or be "canted." Generally, the rotation is between zero and eighty degrees.

A conductive line is aligned near the MRAM bit and is configured such that when a current is passed through the conductive line, a magnetic field is applied to the MRAM bit to rotate the magnetization direction of the storage layer.

When determining a logical state of the MRAM bit (value of the binary datum), a first magnetic field is applied to the MRAM bit for canting the magnetization direction of the storage layer of the bit. While the magnetization direction is held in a canted state, a canted measure is obtained correlative (either direct or inverse, e.g.) with a resistivity of the MRAM bit having its storage layer with a canted magnetization direction. Likewise, a zero-state measure is obtained that is correlative with a resistivity of the MRAM bit in the absence of an applied magnetic field.

The canted measure and zero-state measure are compared to determine a logical state of the MRAM bit. In a particular embodiment, if the canted measure is greater than the zero-state measure, the logical state of the MRAM bit is in an antiparallel state; and if the canted measure is less than the zero-state measure, the logical state of the MRAM bit is in a parallel state.

DETAILED DESCRIPTION OF THE DRAWINGS a) Memory Cell Architecture

Figure 1A:
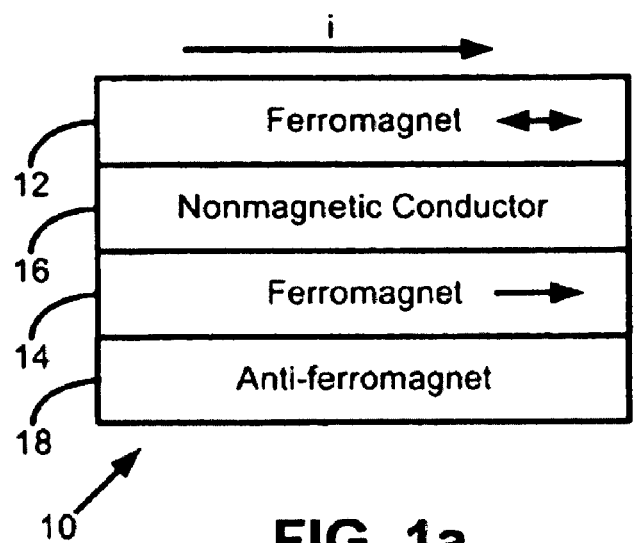
FIG. 1a is a schematic diagram of the layers of a prior art spin valve.
Figure 1B:
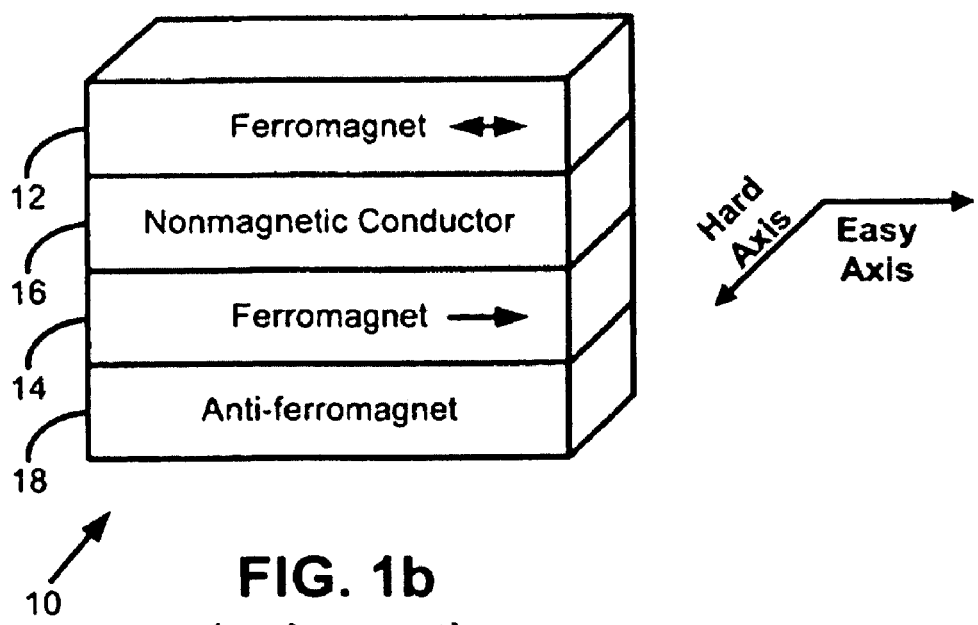
FIG. 1b is a three dimensional view of a prior art spin valve.
Figure 2:
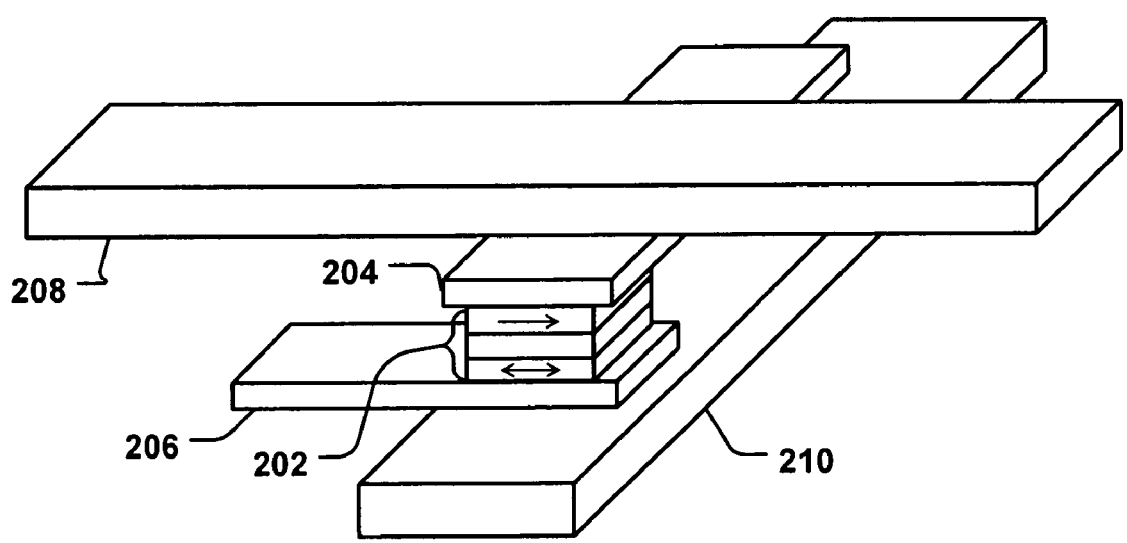
FIG. 2 is a three dimensional view of a spin valve showing conducting lines for reading and writing.

Referring to the drawings, FIG. 2 generally depicts a MRAM cell with separate read and write architecture. An MRAM bit 202 is shown as a tri-layer element having a spacer layer sandwiched between two conducting magnetic layers. Each magnetic layer of the MRAM bit 202 has a magnetization direction. In FIG. 2, the top magnetic layer is shown with a single headed arrow indicating that the magnetization direction of the top magnetic layer does not change during operation of the cell. Thus, the top magnetic layer is known as the pinned layer. The bottom magnetic layer is shown with a double headed arrow indicating that the magnetization direction of the bottom magnetic layer can be inverted during operation of the cell. Thus, the bottom magnetic layer is known as the free layer. As one skilled in the art will recognize, the orientation of the layers can be altered without eliminating the usefulness of the MRAM bit 202.

A first read line 204 is coupled to a first side of the MRAM bit 202 and a second read line 206 is coupled to a second side of the MRAM bit 202. The two read lines are arranged such that a voltage difference between the first read line 204 and the second read line 206 will generate a current flowing through the layers of the MRAM bit 202. The first read line 204 is may run perpendicular to the second read line 206. However, as one skilled in the art will understand, this arrangement is not necessary. For example, in another embodiment, the second read line 206 does not run perpendicular to first read line 204, but rather terminates at a ground after passing through a select transistor.

A first write line 208 is shown above the first read line 204. The first write line 208 is separated from the first read line 204 and from the rest of the cell by a first insulative spacer (not shown). The first write line 208 is arranged near the MRAM bit 202 such that a current passing through the first write line 208 creates a magnetic field that acts on the MRAM bit 202.

A second write line 210 is shown below the second read line 206. The second write line 210 is separated from the second read line 206 and from the rest of the cell by a second insulative spacer (not shown). The second write line 210 is arranged near the MTJ element 202 such that a current passing through the second write line 210 creates a magnetic field that acts on the MRAM bit. The first write line 208 is generally arranged to run perpendicular to the second write line 210. However, as one skilled in the art will understand, this arrangement is not necessary.

A logical state of the cell depends upon the relative orientation of the magnetization directions of the magnetic layers of the MRAM bit 202. Thus, the logical state of the cell is set by orientating the magnetization layers. A first current passing through the first write line 208 and a second current passing through the second write line 210 create a combined magnetic field. The combined magnetic field acts on the MTJ element 202 to invert the orientation of the magnetization direction of the free layer of the MRAM bit 202.

To determine the logical state of the MRAM bit 202, a voltage difference is created between the first read line 204 and the second read line 206. The voltage difference results in a current passing perpendicularly through the layers of the MTJ element 202. The value of the current is indicative of the logical state of the MTJ element.

The arrangement shown in FIG. 2 may be most applicable to a bit with a high top to bottom resistivity such as a magnetic tunnel injunction (MJT). In another embodiment, such as where the spacer layer is a conductive layer, the read lines may be coupled with the bit ends so that the read current flows along the easy axis of the bit.

b) Magnetic Switching Process

Figure 3:
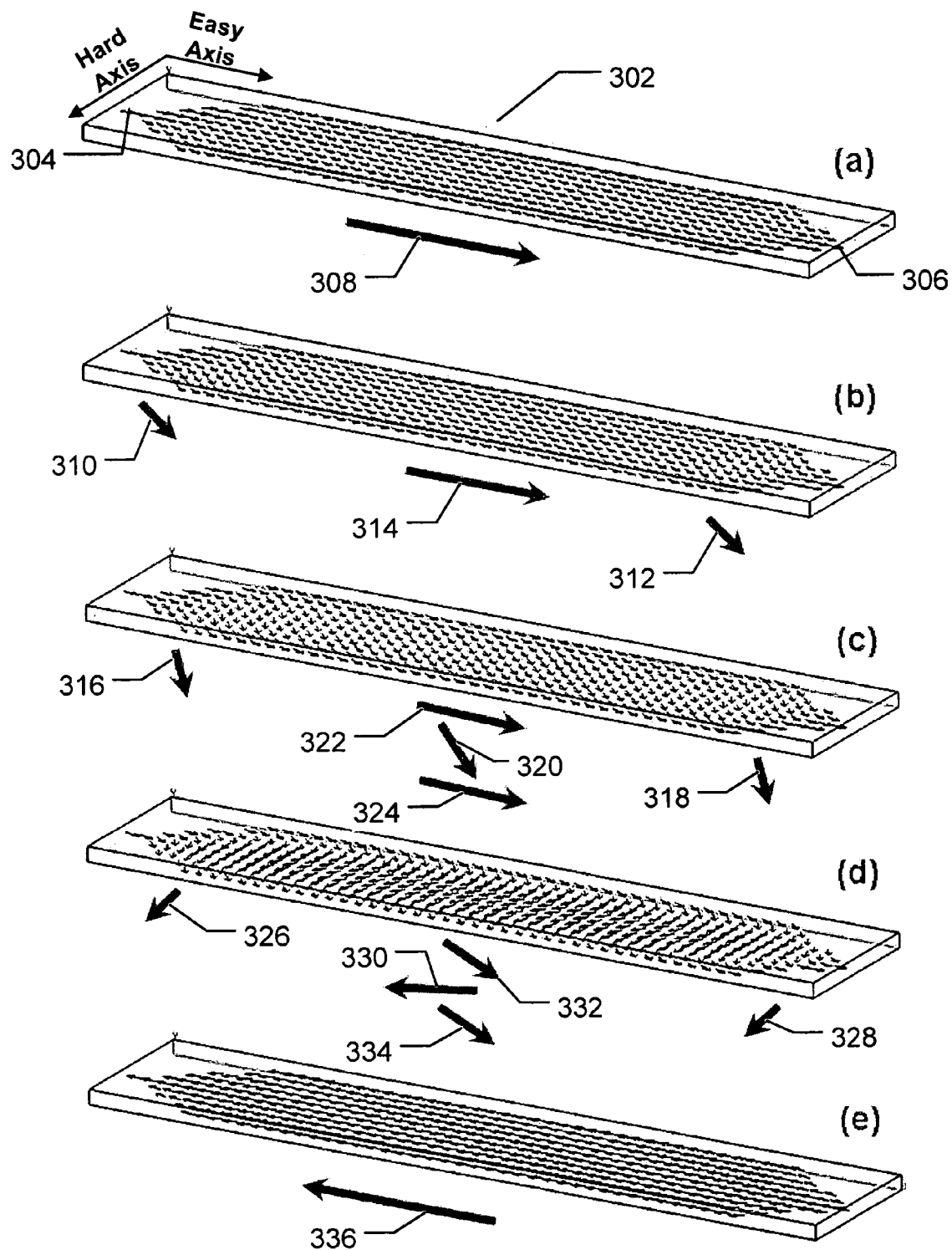
FIG. 3 is a sequential diagram of a magnetic switching process in a magnetic layer.

In a magnetoresistive bit with a pair of magnetic layers, a logical state of the bit is determinable from the magnetization directions of the magnetic layers. The logical state may be switched from a first state to a second state by switching (or inverting) the magnetization direction of one of the magnetic layers. Referring to FIG. 3, a series of frames chronicle a finite analysis of a magnetic switching process in a magnetic layer of a magnetoresistive bit in a prophetic example. In general, the series shows that the switching process involves a coordinated rotation (or reversal) of elemental magnetization directions within the magnetic layer.

Looking first at Frame (a), a magnetic layer 302 is shown as an elongated element with tapered bit ends (304 and 306). For convenience, the bit ends are labeled a first bit end 304 and a second bit end 306. An easy-axis (long-axis) of the magnetic layer 302 is shown running parallel to the elongation of the magnetic layer 302. A hard-axis (short-axis) is aligned in the plane of the magnetic layer 302 and runs perpendicular to the easy-axis. Within magnetic layer 302, elemental magnetization directions are shown as small arrows pointing along the easy-axis toward the second bit end 306. Magnetic exchange between the bit ends and the body of the bit would tend to make the magnetization uniform and unidirectional. (Magnetization exchange is the ferromagnetic exchange that tends to magnetize a magnetic domain of an ensemble of atoms in a given direction.)

A summary arrow 308 shows a composite magnetization direction of the magnetic layer 302 pointing along the easy-axis toward the second bit end 306. The uniform magnetization along the easy-axis as shown in Frame (a) is indicative of a first logical state.

Frames (b), (c), (d), and (e) represent the magnetic layer 302 in sequential scenes of a switching process. Thus, in parallel fashion, the first bit end 304 is the leftmost end of the magnetic layer in each frame, and the second bit end 306 is the rightmost end of the magnetic layer in each frame.

Jumping to Frame (e), the final frame, elemental magnetization directions are shown pointing along the easy-axis toward the first bit end 304. Frame (e) summary arrow 336 shows a generalized magnetization direction pointing in the opposite direction of Frame (a) summary arrow 308. The uniform magnetization along the easy-axis as shown in Frame (e) is indicative of a second logical state. Thus, the objective of a switching process is to switch the logical state of the magnetization layer 302 from the first logical state to the second logical state. Frames (b), (c), and (d) give further detail of the switching process.

In Frame (b), the elemental magnetization directions as shown by small arrows in the magnetic layer are no longer uniform across the entire magnetic layer. Specifically, elemental magnetization directions at the bit ends have begun to rotate clockwise toward the hard-axis. However, elemental magnetization directions in the elongated portion of the magnetic layer continue to point toward the second bit end 306. Frame (b) summary arrows (310, 312, and 314) mirror the elemental magnetization. In Frame (b), it can be seen that the switching process is initiated in the bit ends (304 and 306).

In Frame (c), the elemental magnetization directions show further rotation. Frame (c) summary arrows (316-324) mirror the rotation of the elemental magnetization directions. Bit end summary arrows (316 and 318) indicate further rotation of elemental magnetization directions at the bit ends (304 and 306). A center of the elongated portion of the magnetic layer has begun to rotate clockwise as shown by center summary arrow 320. Edge summary arrows (322 and 324) show little rotation and indicate that elemental magnetization directions along edges of the elongated portion continue to substantial point toward the second bit end 306.

In Frame (d), bit end summary arrows (326 and 328) indicate continued rotation of elemental magnetization directions in the bit ends (304 and 306). The center of the elongated portion continues to rotate as shown by summary arrow 330. Edge summary arrows (332 and 334) indicate that elemental magnetization directions along the edges has begun to rotate in earnest.

Finally, Frame (e) shows a completed rotation and reformation of the uniformity of elemental magnetization directions across the magnetic layer. FIG. 3 in general shows how switching of the magnetization direction of the magnetic layer is initiated in the bit ends, continues through the center of the layer, and completes with reversal of the edges.

Although each intermediate frame (b), (c), (d) include elemental magnetization directions in several different directions, composite magnetization directions can be calculated through, for instance, an elemental average. In an alternative embodiment, the composite magnetization directions for the frames are shown by the center summary arrows (314, 320, 330).

As will be understood by one skilled in the art, the first and second logical states may be arbitrarily selected. Thus switching the magnetic layer from the second logical state to the first logical state involves a mirror-image procedure as switching from the first logical state to the second logical state. FIG. 3 is intended to serve as an example of a switching process and should not be seen as limiting.

c) Canted Magnetization Direction

Figure 4:
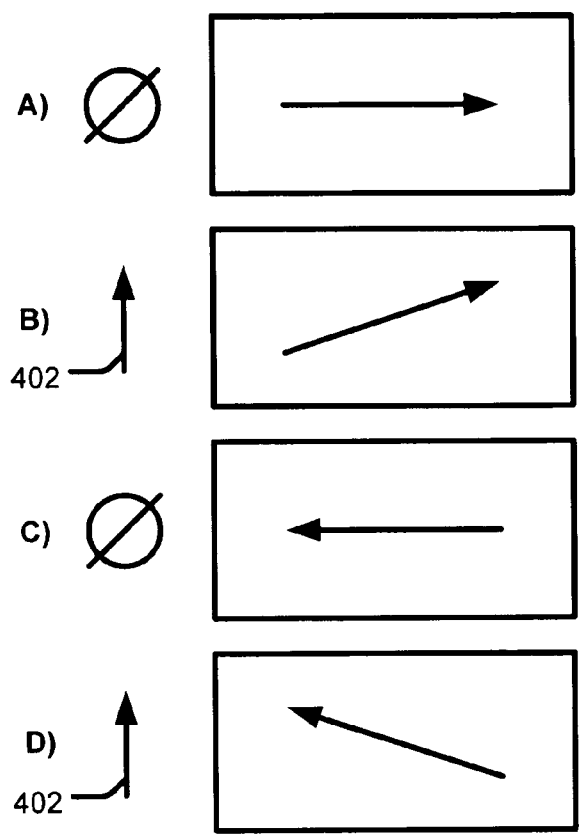
FIG. 4 is a schematic diagram showing a composite magnetization direction in a storage layer at a plurality of time points.

By applying a low level magnetic field to an MRAM bit, the magnetization direction can be canted without flipping the overall magnetization direction. FIG. 4 is a series of schematic diagrams showing a composite magnetization direction of a storage layer of an MRAM bit in a prophetic example. FIG. 4a shows a magnetization direction running from left to right along the easy axis of the storage layer in the absence of an applied magnetic field. FIG. 4b shows a canted magnetization direction after a magnetic field 402 is applied to the storage layer shown in FIG. 4a. As shown, the canted magnetization direction in FIG. 4b is between zero and eighty degrees from the easy axis but is not over ninety degrees. In another embodiment, the canted magnetization direction is between five and forty degrees from the easy axis. In another embodiment, the canted magnetization direction is thirty degrees from the easy axis. When applying a magnetic field for canting the magnetization direction, the field should not be sufficient to flip (switch) the magnetization direction.

FIG. 4c shows a magnetization direction running from right to left along the easy axis of the storage layer in the absence of the applied magnetic field. FIG. 4c provides an example of the magnetization direction being switched from FIG. 4a. FIG. 4d shows a canted magnetization direction after a magnetic field 402 is applied to the storage layer shown in FIG. 4c.

The magnetic field 402 may be created by a passing a current through a conductive line aligned near the MRAM bit. For instance, in FIG. 2, the magnetic field 402 for causing the rotation of the magnetization direction may be created by passing a current through line 208.

In various embodiments, FIG. 3, frames (b), (c), and (d) are examples of magnetic layers having canted magnetization directions. Generally, the canted magnetization directions are not stable without the aid of a continuously applied magnetic field. When the magnetic field is removed, the magnetic layer may revert to its by-stable state with a magnetic direction pointing along an easy axis.

d) Effect of Canting on Physical Phenomena

A fundamental aspect of MRAM technology lies in the phenomena that physical properties of an MRAM bit will change according to the relative magnetization directions of the magnetic layers of the bit. Thus, for instance, when the storage layer is parallel to the pinned layer, resistivity of the bit is low, and when the two layers are antiparallel, resistivity of the bit is high.

Canting the magnetization direction of one of the layers relative to the other can also alter the physical properties of the MRAM bit. Thus, in a bit having parallel magnetic layers, canting one of the layers increases the resistivity of the bit. Likewise, in a bit having antiparallel magnetic layers, canting one of the layers decreases the resistivity of the bit.

The resistivity of the bit can be measured/calculated in a variety of fashions. A known voltage applied across the bit will produce a current that is inversely proportional to the resistivity while a known current passed through the bit will create a voltage across the bit that is proportional to the resistivity. Thus, voltage or current are measures correlative with resistivity.

e) Operation of an Embodiment

In an exemplary embodiment, a state of the MRAM bit can be determined without relying on a reference bit. This method uses a self-referencing system to determine the logical state of the MRAM bit without switching the magnetization direction of any of the magnetic layers.

Figure 5:
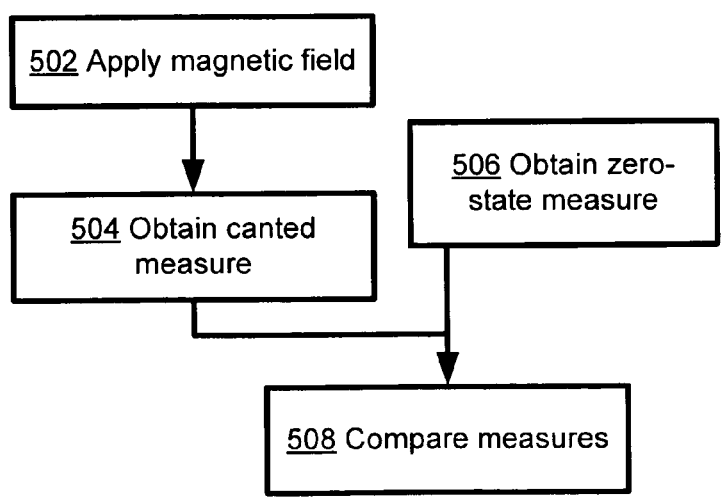
FIG. 5 is a flow chart showing exemplary operation.

FIG. 5 shows operation of an embodiment. At 502, a magnetic field is applied to the MRAM bit for canting the magnetization direction of the storage layer of the bit. In the exemplary embodiment, a pinned layer has a much higher coercivity and thus has relatively little canting of its magnetization direction due to the applied magnetic field.

While magnetic field is being applied, at 504, a canted measure is obtained that is correlative (either directly or inversely, e.g,) with the resistivity of the MRAM bit. Thus, the canted measure is a measure correlative with resistivity when the storage layer has a canted magnetization direction.

With no magnetic field applied, at 506 a zero-state measure is obtained that is correlative with the resistivity of the MRAM bit when the storage layer has a magnetization direction in one of the bi-stable directions along the easy-axis (i.e., non-volatile magnetization direction).

At 508, the canted measure is compared with the zero-state measure to determine a logical state of the MRAM bit. Generally, if the canted resistivity is greater than the zero-state resistivity then the logical state of the MRAM bit is antiparallel, and if the canted resistivity is less than the zero-state resistivity then the logical state of the MRAM bit is parallel. Antiparallel and parallel could then be correlated to 0 and 1.

In a further embodiment (not shown), a third measure may be obtained of the MRAM bit with another magnetic field (such as one in the opposite direction) applied to the MRAM bit. This third measure can then be used in the comparison to better determine a value for the logical state of the MRAM bit.

f) Conclusion

A variety of embodiments have been described above. More generally, those skilled in the art will understand that changes and modifications may be made to these embodiments without departing from the true scope and spirit of the present invention, which is defined by the claims. Thus, for example, the bit should not be limited to devices having a conductive spacer layer. Finally, device design, processing, and test conditions all affect magnetization switching characteristics and are therefore should be considered.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A method of determining a logical state of an MRAM bit, comprising:
    applying a first magnetic field to the MRAM bit for canting a magnetization direction of a storage layer of the bit;
    obtaining a canted measure correlative with a resistivity of the MRAM bit having its storage layer with a canted magnetization direction;
    obtaining a zero-state measure correlative with a resistivity of the MRAM bit having its storage layer with a non-canted magnetization direction; and
    comparing the canted measure with the zero-state measure to determine a logical state of the MRAM bit.

2. The method of claim 1, wherein canting a magnetization direction of the storage layer includes rotating a zero-state composite magnetization direction between zero and eighty degrees.

3. The method of claim 1, wherein applying the first magnetic field includes passing a current through a conductive line aligned near the MRAM bit.

4. The method of claim 3, wherein the conductive line is substantially parallel with an easy axis of the MRAM bit.

5. The method of claim 1, wherein obtaining the canted measure includes passing a current through the MRAM bit while the storage layer has a canted magnetization direction.

6. The method of claim 1, wherein the zero-state magnetization direction is a non-volatile magnetization direction and wherein the canted magnetization direction is a volatile magnetization direction.

7. The method of claim 6, wherein obtaining the canted measure occurs while the first magnetic field is being applied.

8. The method of claim 1, wherein comparing the canted measure with the zero-state measure includes:
    if the canted measure is greater than the zero-state measure, determining that the logical state of the MRAM bit is in an antiparallel state; and
    if the canted measure is less than the zero-state measure, determining that the logical state of the MRAM bit is in a parallel state.

9. The method of claim 1, wherein the MRAM bit includes:
    the storage layer having a switchable magnetization direction;
    a reference layer having a fixed magnetization direction; and
    a nonmagnetic spacer layer sandwiched between the storage layer and the reference layer.

10. The method of claim 9, wherein a coercivity of the storage layer is greater than a coercivity of the reference layer such that the first magnetic field does not cant the magnetization direction of the reference layer.

11. The method of claim 1, wherein the canted measure correlative with a resistivity is a measure of one of (i) a current passing through the MRAM bit and (ii) a voltage applied across the MRAM bit.

12. A method comprising:
    providing an MRAM bit including a magnetic storage layer, a magnetic reference layer, and a nonmagnetic spacer layer sandwiched between the storage and reference layers;
    obtaining a first measure of a first type, the first measure being indicative of a physical state of the MRAM bit in the absence of an applied magnetic field;
    obtaining a second measure of the first type, the second measure being indicative of a physical state of the MRAM bit having an applied magnetic field partially rotating a composite magnetization direction of the storage layer;
    comparing at least the first measure and the second measure when determining a logical state of the MRAM bit.

13. The method of claim 12, wherein the applied magnetic field is applied substantially perpendicular to an easy axis of the MRAM bit.

14. The method of claim 13, wherein the partially rotated composite magnetization direction of the storage layer is between ten and eighty degrees from the easy axis.

15. The method of claim 12, further comprising:
    after obtaining the second measure, removing the applied magnetic field, wherein the magnetization direction of the storage layer rotates back to a nonvolatile position.

16. The method of claim 15, wherein the magnetization direction is not reversed during the method.

17. The method of claim 12, wherein comparing at least the first measure and second measure comprises:
    if the first measure is greater than the second measure, determining that the logical state of the MRAM bit is a first binary value; and
    if the first measure is less than the second measure, determining that the logical state of the MRAM bit is a second binary value.

18. The method of claim 12, further comprising:
    obtaining a third measure of the first type, the third measure being indicative of a physical state of the MRAM bit having a second applied magnetic field partially rotating the composite magnetization direction of the storage layer; and
    comparing the third measure with the first measure and second measure when determining the logical state of the MRAM bit.

19. An MRAM cell comprising:
    an MRAM multilayer bit including: a magnetic storage layer having a bi-stable switchable composite magnetization direction; a reference layer having a fixed composite magnetization direction; and a nonmagnetic spacer layer sandwiched between the storage layer and the reference layer, the bit being configured to store a binary datum, the magnetization direction of the storage layer being indicative of the binary datum;
    a conductive line aligned near the MRAM bit, the conductive line configured such that when a current is passed through the line, a magnetic field is applied to the MRAM bit to rotate the composite magnetization direction of the storage layer, the rotation being between ten and eighty degrees from the bi-stable magnetization direction of the switching layer;
    a read line passing through the MRAM bit and coupled with a sensor for determining a logical state of the MRAM bit; and a logic circuit for comparing a first measure from the sensor obtained when the composite magnetization direction of the storage layer is being rotated by the applied magnetic field with a second measure obtained in the absence of the applied magnetic field.

20. The MRAM cell of claim 19, wherein the first measure and second measure are each indicative of a resistance through the MRAM bit, and wherein the logic circuit determines the greater of the first measure and second measure, the greater being indicative of the binary datum.

* * * * *